United States Patent
Kruijt-Stegeman et al.

(10) Patent No.: US 7,377,764 B2
(45) Date of Patent: May 27, 2008

(54) IMPRINT LITHOGRAPHY

(75) Inventors: Yvonne Wendela Kruijt-Stegeman, Eindhoven (NL); Aleksey Yurievich Kolesnychenko, Helmond (NL); Erik Roelof Loopstra, Heeze (NL); Johan Frederik Dijksman, Weert (NL); Helmar Van Santen, Amsterdam (NL); Sander Frederik Wuister, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 284 days.

(21) Appl. No.: 11/150,465

(22) Filed: Jun. 13, 2005

(65) Prior Publication Data

US 2006/0280829 A1 Dec. 14, 2006

(51) Int. Cl.
*B28B 11/08* (2006.01)

(52) U.S. Cl. ............ 425/174.4; 430/22; 430/324; 264/401; 425/385

(58) Field of Classification Search ........... 425/174.4, 425/385, DIG. 47; 355/48, 72, 91, 887; 396/428; 430/22, 322, 30, 324; 264/401; 427/458; 700/240
See application file for complete search history.

(56) References Cited

U.S. PATENT DOCUMENTS

| | | | |
|---|---|---|---|
| 5,182,056 A * | 1/1993 | Spence et al. | 264/401 |
| 5,512,131 A | 4/1996 | Kumar et al. | 156/655.1 |
| 5,772,905 A | 6/1998 | Chou | 216/44 |
| 6,165,911 A | 12/2000 | Calveley | 438/754 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,710,845 B2 * | 3/2004 | Wu et al. | 355/30 |
| 6,719,915 B2 | 4/2004 | Willson et al. | 216/44 |
| 6,921,615 B2 | 7/2005 | Sreenivasan et al. | 430/22 |
| 2002/0093122 A1 | 7/2002 | Choi et al. | 264/401 |
| 2002/0094496 A1 | 7/2002 | Choi et al. | 430/322 |

(Continued)

FOREIGN PATENT DOCUMENTS

WO   WO 01/79591 A1   10/2001

(Continued)

OTHER PUBLICATIONS

Heon Lee et al., Full Wafer Scale Near Zero Residual Nano-Imprinting Lithography Using UV Curable Monomer Solution, Microelectronic Engineering 77 (2005) pp. 42-47.

(Continued)

*Primary Examiner*—Yogendra N. Gupta
*Assistant Examiner*—Thu Khanh T. Nguyen
(74) *Attorney, Agent, or Firm*—Pillsbury Winthrop Shaw Pittman, LLP

(57) ABSTRACT

A lithographic apparatus is disclosed that has an imprint template or a template holder configured to hold an imprint template, and a substrate table arranged to receive a substrate, the apparatus further comprising walls which together with the substrate table and the imprint template or the template holder, are configured to form an enclosed space which is substantially sealed from a surrounding area.

31 Claims, 6 Drawing Sheets

U.S. PATENT DOCUMENTS

| | | |
|---|---|---|
| 2002/0132482 A1 | 9/2002 | Chou .......................... 438/692 |
| 2002/0167117 A1 | 11/2002 | Chou .......................... 264/338 |
| 2002/0177319 A1 | 11/2002 | Chou .......................... 438/690 |
| 2003/0034329 A1 | 2/2003 | Chou ........................... 216/44 |
| 2003/0080471 A1 | 5/2003 | Chou .......................... 264/338 |
| 2003/0080472 A1 | 5/2003 | Chou .......................... 264/338 |
| 2003/0081193 A1 | 5/2003 | White et al. .................. 355/72 |
| 2003/0127580 A1 | 7/2003 | Ling et al. .................. 249/115 |
| 2003/0139042 A1 | 7/2003 | Heidari ....................... 438/689 |
| 2003/0141291 A1 | 7/2003 | Heidari et al. ........... 219/460.1 |
| 2003/0159608 A1 | 8/2003 | Heidari ....................... 101/494 |
| 2003/0170053 A1 | 9/2003 | Montelius et al. .......... 399/318 |
| 2003/0189273 A1 | 10/2003 | Olsson ....................... 264/293 |
| 2004/0005444 A1 | 1/2004 | Heidari ....................... 428/212 |
| 2004/0008334 A1 | 1/2004 | Sreenivasan et al. |
| 2004/0009673 A1 | 1/2004 | Sreenivasan et al. ....... 438/694 |
| 2004/0021866 A1 | 2/2004 | Watts et al. ................ 356/401 |
| 2004/0022888 A1 | 2/2004 | Sreenivasan et al. .... 425/174.4 |
| 2004/0036201 A1 | 2/2004 | Chou et al. ................. 264/402 |
| 2004/0046288 A1 | 3/2004 | Chou ......................... 264/479 |
| 2004/0081798 A1 | 4/2004 | Lee et al. ................... 428/141 |
| 2004/0124566 A1 | 7/2004 | Sreenivasan et al. ....... 264/494 |
| 2004/0149367 A1 | 8/2004 | Olsson et al. ................. 156/64 |
| 2004/0169003 A1 | 9/2004 | Lee et al. ...................... 216/4 |
| 2004/0192041 A1 | 9/2004 | Jeong et al. ................ 438/689 |
| 2004/0200411 A1 | 10/2004 | Willson et al. ............. 118/500 |
| 2004/0209470 A1 | 10/2004 | Bajorek ...................... 438/689 |
| 2004/0219249 A1 | 11/2004 | Chung et al. ................ 425/385 |
| 2004/0219461 A1 | 11/2004 | Chung et al. ................ 430/311 |
| 2005/0039618 A1 | 2/2005 | Heidari et al. .............. 101/368 |
| 2005/0064054 A1 | 3/2005 | Kasumi ....................... 425/112 |

FOREIGN PATENT DOCUMENTS

| | | |
|---|---|---|
| WO | WO 01/79592 A1 | 10/2001 |
| WO | WO 2005/033797 A2 | 4/2005 |

OTHER PUBLICATIONS

Stephen Y. Chou, et al., "Nanoimprint Lithography", J. Vac. Sci. Technol. B 14(6), Nov./Dec. 1996, pp. 4129-4133.

* cited by examiner

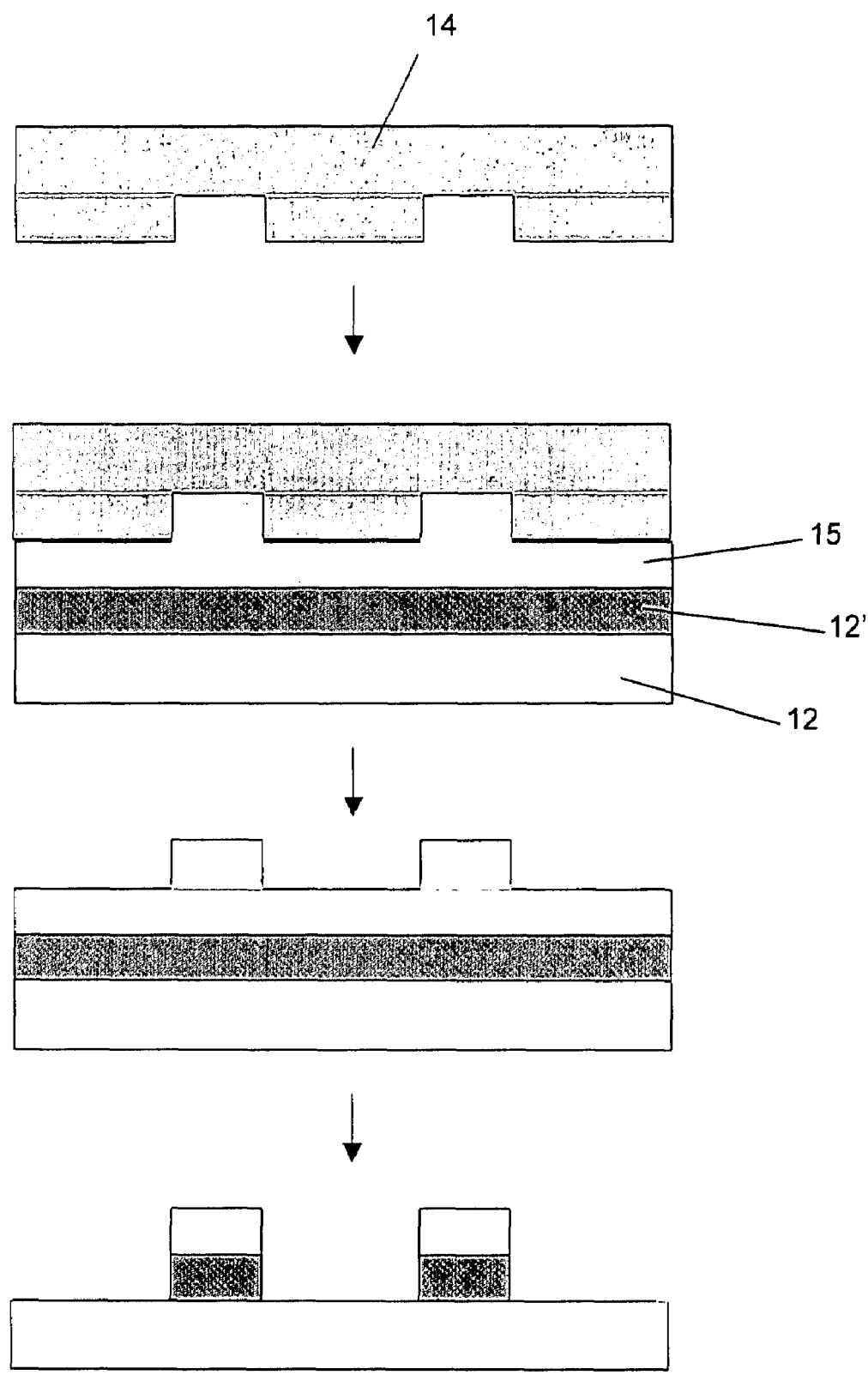
Prior Art                        Figure 1b

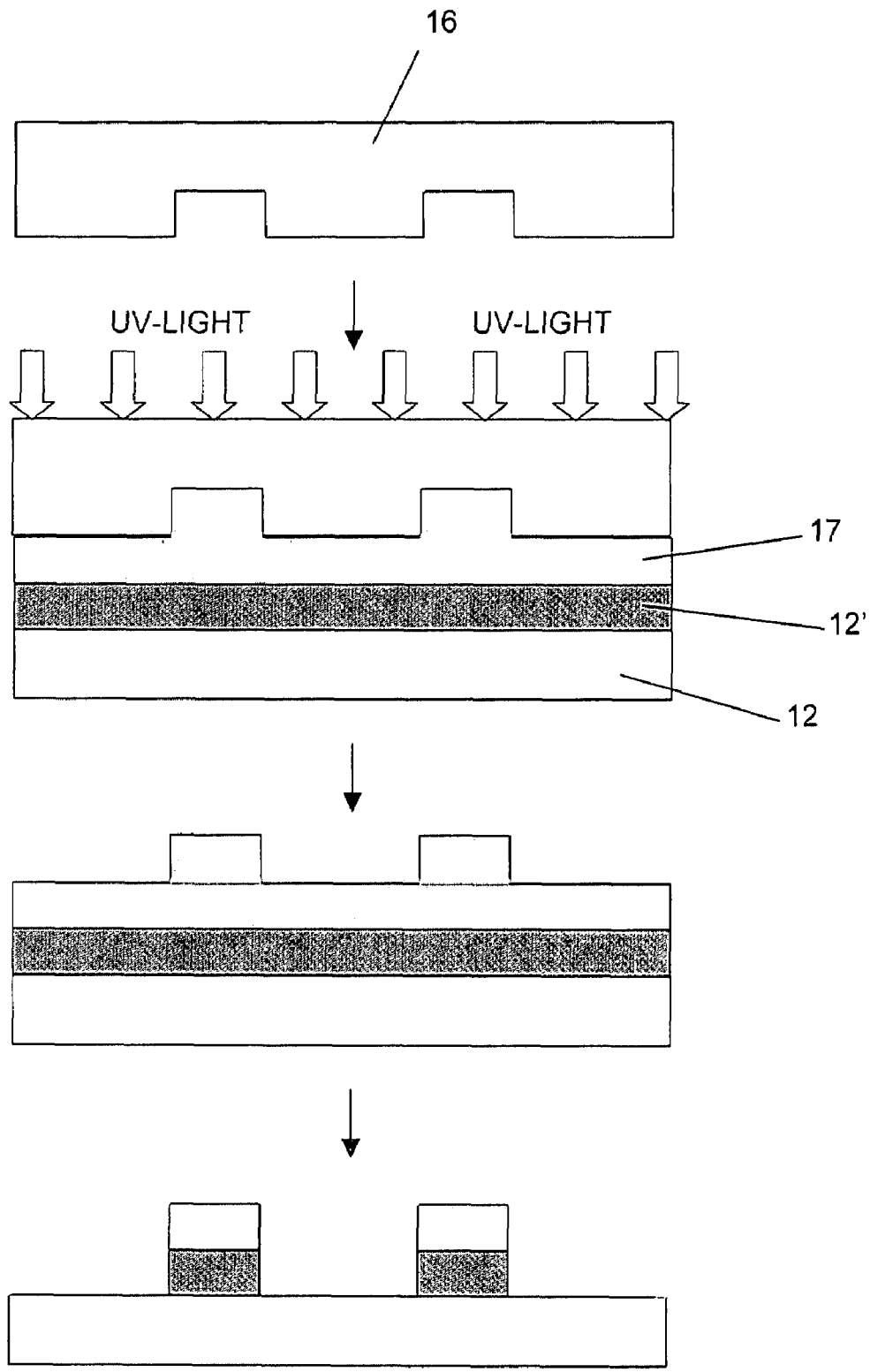
Prior Art Figure 1c

IMPRINT LITHOGRAPHY

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may for instance be provided as a resist deposited on a substrate such as a semiconductor material to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as IC manufacture.

The resolution of imprint lithography is limited only by the resolution of the template fabrication process for instance, imprint lithography has been used to produce features in the sub-50 nm range with significantly improved resolution and line edge roughness compared to that achievable with conventional optical lithography processes. In addition, imprint processes do not require expensive optics, advanced illumination sources or specialised resist materials typically required by optical lithography processes.

Current imprint lithography processes do have a number of drawbacks as will be mentioned below, particularly with regard to achieving overlay accuracy and high throughput. However the significant improvements in resolution and line edge roughness attainable from imprint lithography are strong drivers for addressing these and other problems.

A problem which may arise during imprint lithography is that gas bubbles, also known as air inclusions, may be trapped underneath an imprint template during the imprint process. These trapped gas bubbles do not migrate out from beneath the imprint template, but instead stay there for the duration of the imprint process. When the imprint template is removed from the imprintable material (which may be a UV curable resin), an area of the imprinted pattern will be incomplete or otherwise damaged at the location of the gas bubble.

3. SUMMARY

According to a first aspect of the present invention there is provided a lithographic apparatus comprising an imprint template or a template holder configured to hold an imprint template, and a substrate table arranged to receive a substrate, the apparatus further comprising walls which together with the substrate table and the imprint template or the template holder, are configured to form an enclosed space which is substantially sealed from a surrounding area.

According to a second aspect of the invention there is provided a method of imprint lithography using an imprint template, a substrate table and walls, the walls and the substrate table configured to form an enclosed space together with the imprint template or a template holder holding the imprint template, the enclosed space substantially sealed from a surrounding area, the method comprising providing a substrate on the substrate table, the substrate having a layer of imprintable material, filling the enclosed space with a gas which comprises one or more substances which are constituents of the imprintable material, and imprinting the imprintable material using the imprint template.

One or more embodiments of the present invention are applicable to any imprint lithography process in which a patterned template is imprinted into an imprintable medium in a flowable state, and for instance can be applied to hot and UV imprint lithography as described above. For the purpose of understanding one or more embodiments of the present invention, it is not necessary to describe the imprint process in any more detail than has already been given and is known in the art.

Further features of one or more embodiments of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1c illustrate examples of conventional soft, hot and UV lithography processes respectively;

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
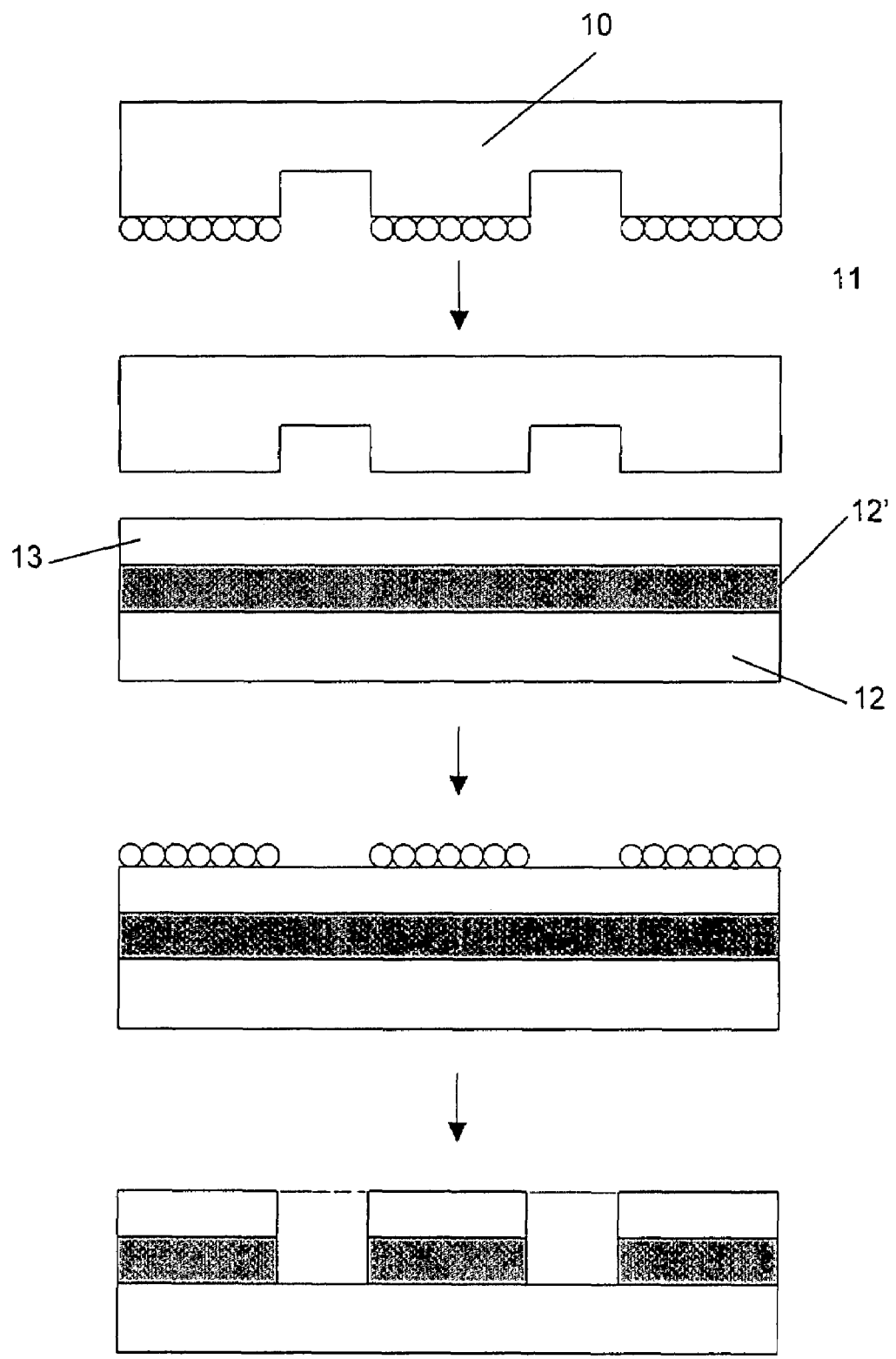

FIG. 1a shows the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarisation and transfer layer 12'. The template 10 has a pattern of features on its surface, the molecular layer being disposed upon the features. When the template is pressed against the resist layer the layer of molecules 11 stick to the resist. Upon removal of the template from the resist the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described for instance in U.S. Pat. No. 6,482,742 and illustrated in FIG. 1b. In a typical hot imprint process a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarisation and transfer layer 12'. It shall be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
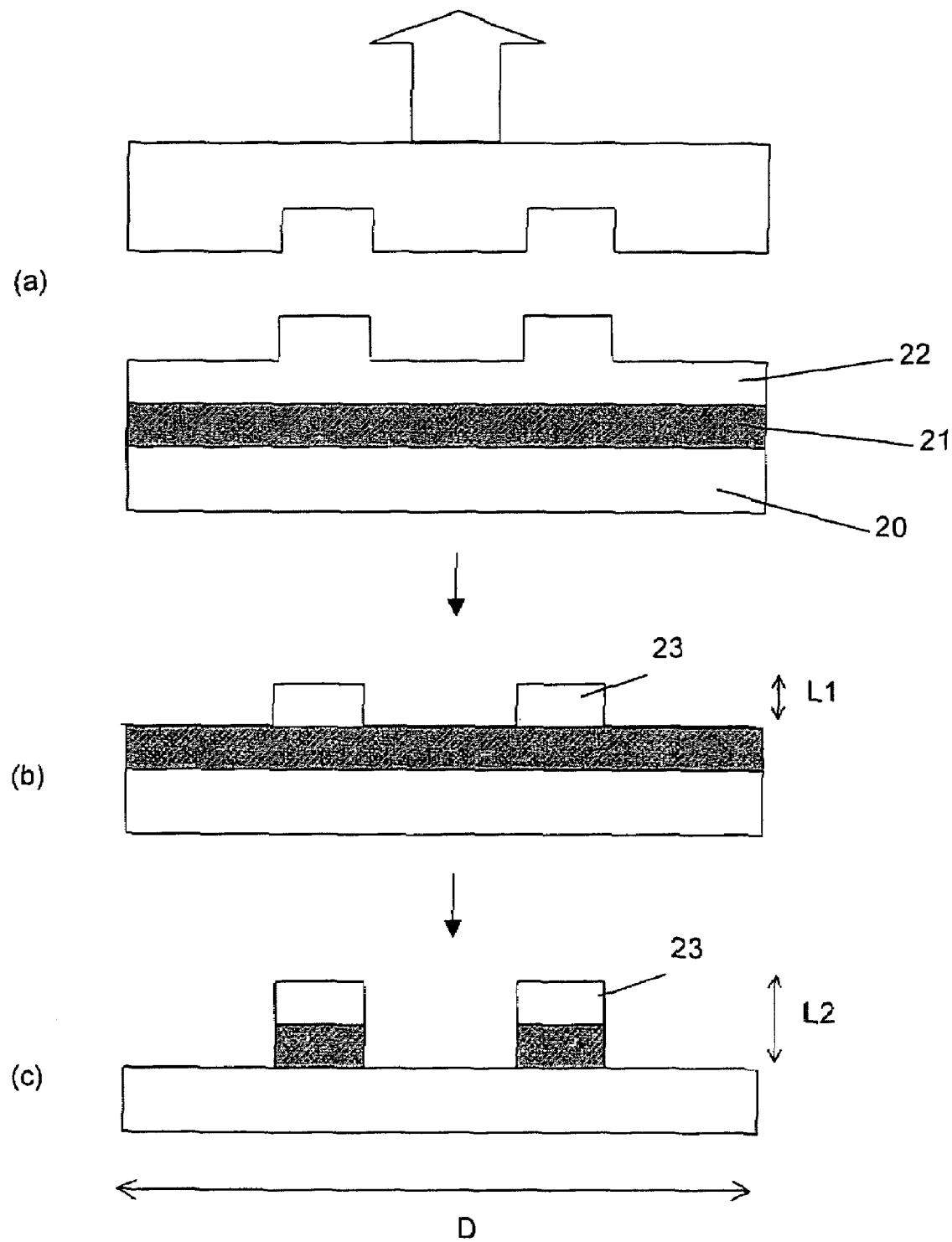
FIG. 2 illustrates a two step etching process employed when hot and UV imprint lithography is used to pattern a resist layer.

Upon removal of the template from the solidified resin, a two-step etching process is performed as illustrated in FIGS. 2a to 2c. The substrate 20 has a planarisation and transfer layer 21 immediately upon it, as shown in FIG. 2a. The purpose of the planarisation and transfer layer is twofold. It acts to provide a surface parallel to that of the template, which is important to ensure that the contact between the template and the resin is parallel, and also to improve the aspect ratio of the printed features, as will be described below.

After the template has been removed, a residual layer 22 of the solidified resin is left on the planarisation and transfer layer, shaped in the desired pattern. The first etch is isotropic and removes parts of the residual layer, resulting in a poor aspect ratio of features where L1 is the height of the features 23, as shown in FIG. 2b. The second etch is anisotropic (or selective) and improves the aspect ratio. The anisotropic etch removes those parts of the planarisation and transfer layer which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer be performed at a higher temperature, but also relatively large temperature differentials might be required in order to ensure the resin is adequately solidified before the template is removed. Temperature differentials between 35 and 100° C. are known from literature. Differential thermal expansion between for instance the substrate and template can then lead to distortion in the transferred pattern. The problem is exacerbated by the relatively high pressures used for the imprinting step, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. In general any photopolymerisable material could be used, such as a mixture of monomers and an initiator. The curable liquid may also for instance include a dimethyl siloxane derivative. Such materials are much less viscous than the thermosetting and thermoplastic resins used in hot imprint lithography and consequently move much faster to fill template pattern features. Low temperature and low pressure operation also favours higher throughput capabilities.

An example of a UV imprint process is illustrated in FIG. 1c. A quartz template 16 is applied to a UV-curable resin 17 in a similar manner to the process of FIG. 1b. Instead of raising the temperature as in hot embossing employing thermosetting resins, or temperature cycling when using thermoplastic resins, UV light is applied to the resin through the quartz template in order to polymerise and thus cure it. Upon removal of the template, the remaining steps of etching the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition the transparent nature of UV imprint templates can accommodate optical alignment techniques simultaneously to the imprint.

Although this type of imprint lithography mainly uses UV curable materials, and is thus generically referred to as UV imprint lithography, other wavelengths of light may be used to cure appropriately selected materials (e.g. activate a polymerisation or cross linking reaction). In general any radiation capable of initiating such a chemical reaction may be used if an appropriate imprintable material is available. Alternative "activating light" may for instance include visible light, infrared light, x-ray radiation and electron beam radiation. In the general description above, and below, references to UV imprint lithography and use of UV light are not intended to exclude these and other activating light possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to roller templates.

There is a particular development of UV imprint technology known as step and flash imprint lithography (SFIL) which may be used to pattern a substrate in small steps in a similar manner to optical steppers conventionally used in IC manufacture. This involves printing small areas of the substrate at a time by imprinting a template into a UV curable resin, 'flashing' UV light through the template to cure the resin beneath the template, removing the template, stepping to an adjacent region of the substrate and repeating the operation. The small field size of such step and repeat processes minimises pattern distortions CD variations so that SFIL is particularly suited to manufacture of IC and other devices requiring high overlay accuracy.

Although in principle the UV curable resin can be applied to the entire substrate surface, for instance by spin coating, this is problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features whilst at the same time minimizing excess resin which can be rolled to an undesirably thick or uneven residual layer since as soon as neighbouring drops touch fluid the resin will have nowhere to flow. The problems associated with overly thick or uneven residual layer are discussed below.

Figure 3:
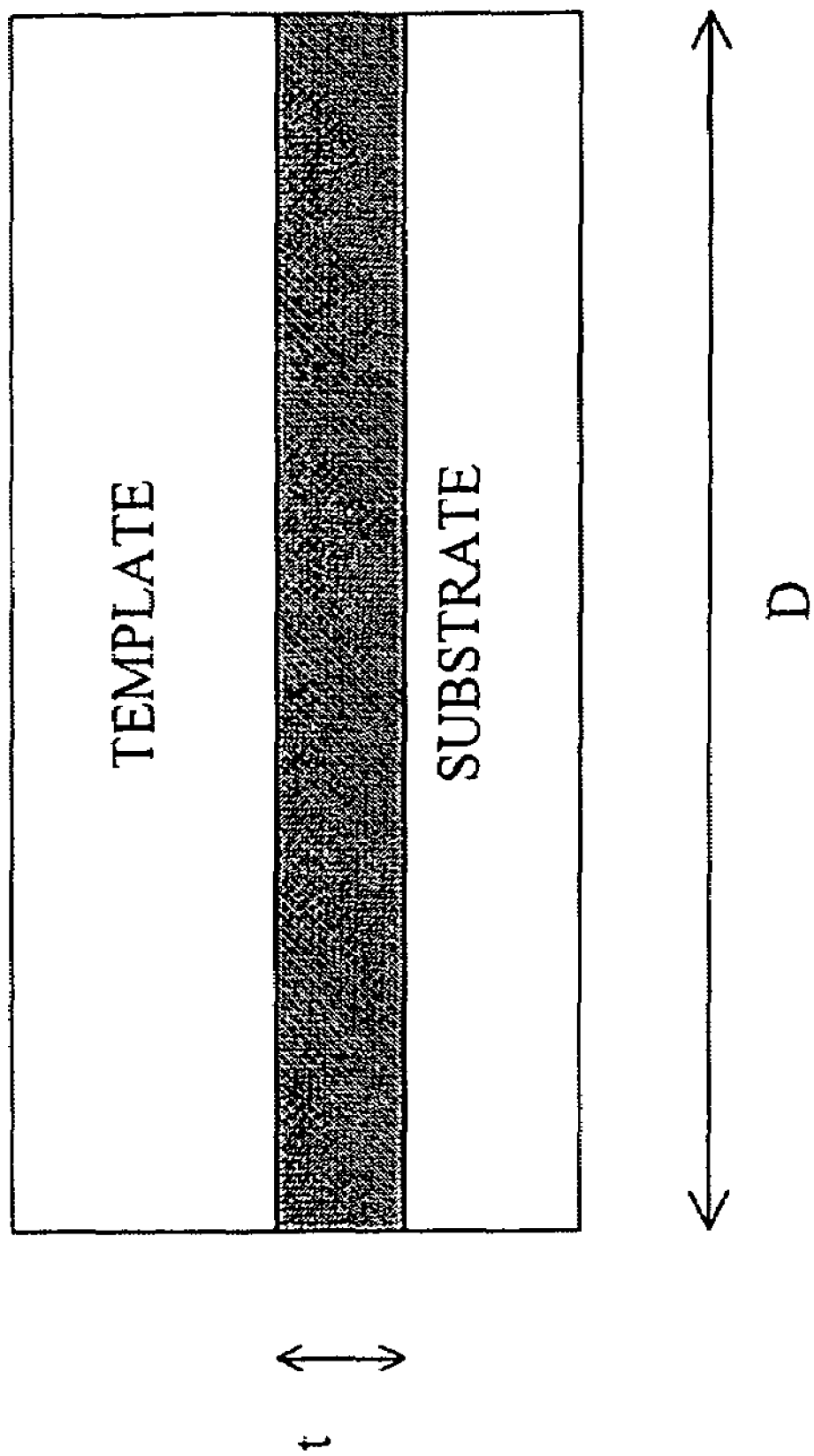
FIG. 3 schematically illustrates a template and a typical imprintable resist layer deposited on a substrate.

FIG. 3 illustrates the relative dimensions of the template, imprintable material (curable monomer, thermosetting resin, thermoplastic etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is desired. The first 'breakthrough' etch is isotropic (non-selective) and will thus to some extent erode the features imprinted as well as the residual layer. This is exacerbated if the residual layer is overly thick and/or uneven.

This problem can for instance lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle the above problem can be reduced by ensuring the residual layer is as thin as possible but this can require application of undesirably large pressures (increasing substrate deformation) and relatively long imprinting times (reducing throughput).

The template is a significant component of the imprint lithography system. As noted above, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally a technique capable of very high resolution will be preferred as the template is effectively a 1 x mask with the resolution of the transferred pattern being limited by the resolution of the pattern on the template.

The release characteristics of the template may also be an important consideration. The template may for instance be treated with a surface treatment material to form a thin release layer on the template having a low surface energy (a thin release layer may also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and may adversely affect the shape of the pattern imprinted upon the substrate.

In hot imprint lithography there are potential advantages in using a template of the same or similar material to the substrate to be patterned in order to minimise differential thermal expansion between the two. In UV imprint lithography the template is at least partially transparent to the activation light and accordingly quartz templates are used. Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

Whilst in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response amongst others. For example the functional material may form a conductive layer, a semiconductive layer, a dielectric layer or a layer having another desirable mechanical, electrical or optical property. Some organic substances may also be appropriate functional materials. Such applications may be within the scope of an embodiment of the present invention.

Figure 4:
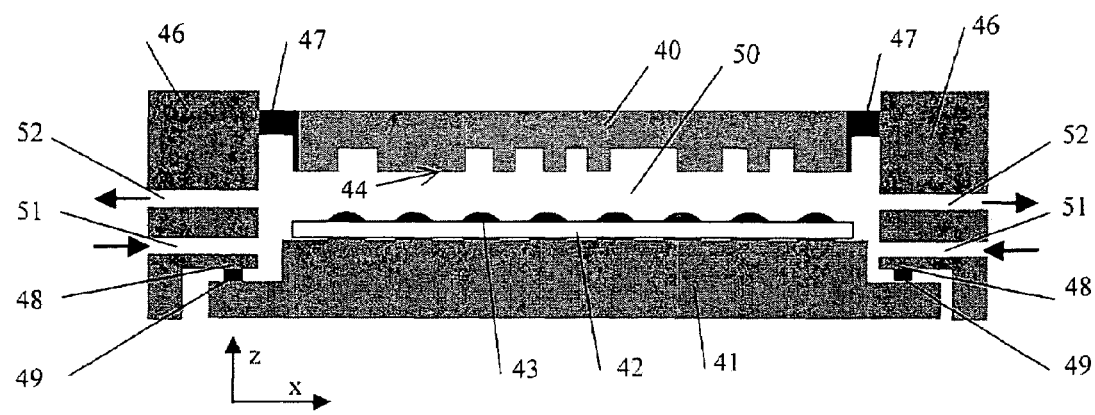
FIGS. 4 and 5 schematically show an imprint lithographic apparatus according to an embodiment of the invention.

FIG. 4 shows schematically an imprint lithographic apparatus comprising an imprint template 40 and a substrate table 41. A substrate 42 is held on the substrate table 41 and is provided with a layer of imprintable material 43. The layer of imprintable material 43 is provided as a series of droplets 43, as shown schematically in FIG. 4. A pattern 44 covers a lowermost surface of the imprint template 40. The pattern 44 is sufficiently large that the entire substrate 42 may be imprinted in a single operation by the pattern. Standard Cartesian coordinates are shown in FIG. 4. It will be appreciated that terms such as 'higher' and 'lower' are intended to be interpreted as meaning in the positive or negative z-direction respectively. In some instances the z-direction may not correspond with the vertical.

Sides of the imprint template 40 press against walls 46 of the lithographic apparatus. Seals 47 are provided between the imprint template 40 and the walls 46. The seals 47 prevent gas from passing between the imprint template 40 and the walls 46.

The imprint template is moveable in the z-direction, in order to allow imprint of the pattern 44 onto the imprintable material 43.

The walls 46 are each provided with a step 48 which is dimensioned to receive the substrate table 41. A seal 49 is provided on the step 48, and presses against the substrate table 41 when the substrate table is in position, thereby preventing gas from passing between the wall 46 and the substrate table. The seal 49 may alternatively or in addition be provided on the substrate table 41.

The effect of the walls 46 together with the imprint template 40, substrate table 41 and the seals 45, 49 is to form an enclosed space 50 which is sealed off from its surroundings.

A first one way valve 51 is provided in each wall 46, and is arranged to pass gas into the enclosed space 50. This valve will hereafter be referred to as the input valve 51. A second one way valve 52 is also provided in each wall 46, and is arranged to draw gas from the enclosed space 50. This valve will hereafter be referred to as the output valve 52. The input valves 51 and the output valves 52 may be connected to a gas generation chamber and a pressure chamber (not illustrated). In one example, the gas generation chamber may comprise a chamber which contains monomer liquid in a vacuum, arranged such that the liquid evaporates to form monomer gas (the chamber including a means to adjust the pressure of the monomer gas). The monomer gas may then be introduced into the enclosed space 50. The manner in which this is done is described further below, as are the constituents of the monomer gas. The pressure chamber may comprise a chamber with a variable volume which is arranged to compensate for the changing volume of the enclosed space 50 during imprint. The valves 51, 52 may also be connected to a waste chamber (not illustrated), the waste chamber being arranged to receive gas which is no longer required (for example used monomer gas). Optionally, the waste chamber may be arranged to clean the gas so that it can be reused.

In use, a substrate 42 provided with a layer of imprintable material 43 is put onto a substrate table 41. The substrate table 41 is then moved to the position shown in FIG. 4, so that it presses against the seals 49, thereby forming the enclosed space 50.

The enclosed space 50 is then filled with a gas which comprises a monomer gas or a mixture of an inert gas together with a monomer gas. This may be done, for example, by pumping out from the enclosed space 50 air (or whatever gas is present within the enclosed space), and allowing the monomer gas or mixture of inert gas and monomer gas to be passively introduced by being drawn into the enclosed space 50 through the input valves 51. The monomer of the gas is the same as a monomer that forms part of the imprintable material 43. The monomer may, for example, be an acrylate or methacrylate. In general the imprintable material 43 may comprise any photopolymerisable material, such as a mixture of one or more monomers, a crosslinker and an initiator. The gas may comprise more than one monomer. In general, if the imprintable material comprises a mixture of monomers, it may be, in an embodiment, that the monomer of the gas is the most volatile monomer.

Figure 5:
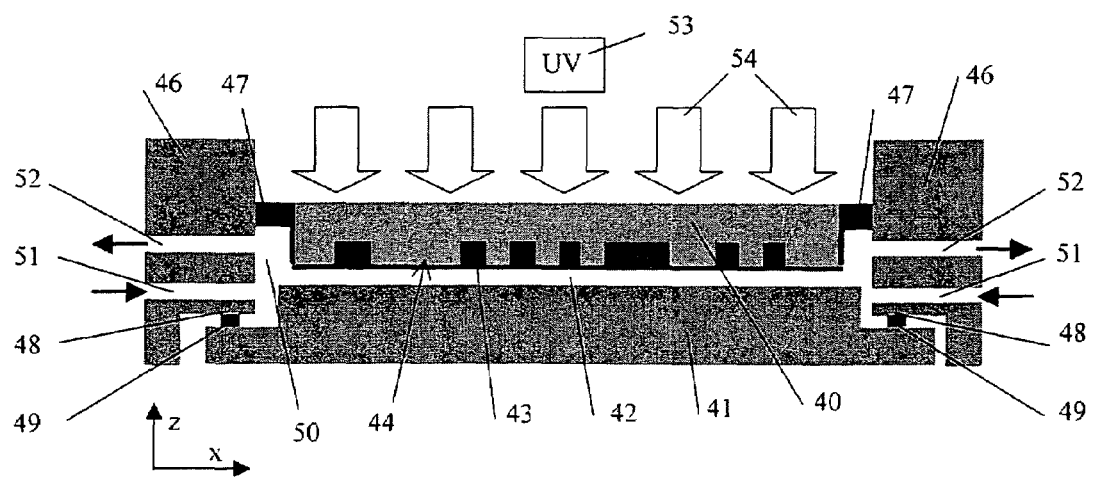

The imprint template 40 is moved downwards (i.e. in the negative z-direction) until the pattern 44 presses into the imprintable material 43. This is shown in FIG. 5 (reference numerals used in FIG. 5 correspond to those used in FIG. 4). The imprintable material 43 flows into recesses of the pattern 44, such that the pattern is imprinted into the imprintable material.

The valves 51, 52 maintain the enclosed space 50 at a substantially constant pressure, even as the size of the enclosed space decreases during downwards movement of the imprint template 40. For example, the output valves 52 may be set such that they allow gas to pass out from the enclosed space 50 when the pressure in the enclosed space reaches a certain level, thereby ensuring that as the imprint template 40 moves downwards towards the substrate 42, the pressure within the enclosed space 50 remains substantially constant.

The imprintable material 43 is cured using UV light emitted from a UV source 53. The UV light passes through the imprint template 40, which is transparent to UV light, and onto the imprintable material (the UV light is indicated by arrows 54). The seals 47 between the imprint template 40 and the walls 46 are not transparent to UV light. They therefore act as shields which shield the valves 51, 52 from the UV light. This is advantageous because if the UV light were to be incident upon the valves 51, 52, then it would cause curing of any molecules of monomer which may have become attached to the valves, thereby fixing the monomer molecules to the one way valves. Over time a build up of cured monomer at the valves would impede their operation. The seals 47 may include a flange, or other element, to ensure that they are sufficiently wide to provide the desired amount of shielding from the UV light. The seals 47 also shield from UV light the seals 49 provided on the steps 48.

Once the imprintable material 43 has been cured by the UV light, the imprint template 40 is moved upwards and away from the substrate 42, until it reaches the position shown in FIG. 4. The valves 51, 52 maintain the enclosed space 50 at a substantially constant pressure, as the size of the enclosed space increases during upwards movement of the imprint template 40. For example, the input valves 51 may be set such that they allow gas to pass into the enclosed space 50 when the pressure in the enclosed space falls below a certain level, thereby ensuring that as the imprint template 40 moves upwards from the substrate 42, the pressure within the enclosed space 50 remains substantially constant. The gas that is passed into the enclosed space could be monomer gas (or a mixture of an inert gas together with a monomer gas). In an embodiment, the gas that is passed into the enclosed space is an inert gas.

The substrate table 41 is removed, with the substrate 42, to allow the substrate to be processed. The act of removing the substrate table 41 opens the enclosed space 50 such that it is in communication with the rest of the apparatus. This is why it is desired that the enclosed space 50 is filled with an inert gas before the substrate table 41 is removed.

A new substrate is placed on the substrate table 41, and the substrate table returned to the position shown in FIG. 4. The enclosed space 50 is then once again filled with the monomer gas (or the mixture of an inert gas together with a monomer gas). Optionally, the enclosed space 50 may first be rinsed with an inert gas after the new substrate has been introduced, before the monomer gas is introduced.

Gas bubbles may be trapped underneath the template 40 such that they are unable to migrate out to the periphery of the imprint template. In prior art lithography systems, this gas would be problematic in that it would cause damage to the pattern in the imprintable material 43. However, in an embodiment of the invention, because the gas comprises in part monomer gas, the monomer condenses into its fluid form, i.e. is converted into imprintable material 43. This conversion of the monomer gas into imprintable material 43 reduces the size of the gas bubbles, and in some cases may even eliminate or substantially eliminate the gas bubbles, thereby reducing or eliminating damage that would otherwise have been caused to the imprinted pattern.

It will be appreciated that the proportion of monomer as compared to inert gas held in the enclosed space 50 will affect the degree to which gas bubbles are reduced or eliminated beneath the template 40. Increasing the proportion of the monomer gas will provide more complete elimination of the gas bubbles. However, if the proportion of monomer gas is too high, for example if the monomer gas is at saturation level, there may be a tendency for droplets of monomer fluid to spontaneously condense from the gas onto unwanted locations within the enclosed space 50. The proportion of monomer gas which provides the best results may be influenced by various aspects of the enclosed space 50, and it may be desired to vary the proportion of monomer gas and monitor results obtained, in order to find an optimum proportion for a given enclosed space. In general, the amount of monomer gas which is present in the enclosed space 50 is significantly greater than that which would be present in gas surrounding a substrate in a conventional imprint lithography apparatus (for example, at the point in time just after the substrate has been introduced into the conventional apparatus).

In an embodiment, during imprint (i.e. when the imprint template is pressing into the imprint material), a slight vacuum at the output valves 52 may be provided to encourage imprintable material 43 to flow towards edges of the imprint template 40. This is advantageous because it causes unwanted imprintable material to more quickly flow from underneath the imprint template 40.

An additional advantage of an embodiment of the invention is that the presence of monomer gas in the enclosed space 50 reduces the rate of evaporation of the monomer from the imprintable material 43. As shown in FIG. 4, the imprintable material 43 is often provided as an array of droplets on the substrate 42. In an embodiment, an array of droplets is provided instead of a single layer of imprintable material, because the total surface area of the array of droplets is less than that of the layer of imprintable material. The reduced surface area provides a correspondingly reduced amount of evaporation. However, evaporation remains a significant problem, especially when smaller droplets are used (this is done to increase the throughput of the imprint process). An embodiment of the invention allows this problem to be considerably reduced and in some cases substantially eliminated, by inhibiting evaporation from taking place.

The greater the proportion of monomer gas in the enclosed space 50, the less evaporation will take place. If the enclosed space 50 were to be saturated with monomer gas, then no net evaporation of the imprintable material 43 will occur. However, as mentioned above, a disadvantage of having monomer gas at saturation level is that monomer fluid may spontaneously condense at unwanted locations. For this reason, as previously mentioned, it may be desired to vary the proportion of monomer gas and monitor results obtained, in order to find an optimum proportion for a given enclosed space 50.

Particular arrays of droplets of imprintable material may provide good imprint results. A supposed example of such an array is shown in US patent application Publication No. 2004/0008334A1, now issued as U.S. Pat. No. 6,900,881. In general, it is difficult to achieve the desired droplet pattern. The patterns are at least in part arranged to attempt to reduce the likelihood that gas bubbles become trapped between an imprint template and a substrate. By reducing or eliminating the occurrence and size of these gas bubbles, an embodiment of the invention may in some cases avoid the need to provide imprintable material in droplet arrays, and may in other cases allow simpler arrays of droplets to be used.

A further advantage of an embodiment of the invention is that, due to the enclosed space 50, monomer which evaporates from the imprintable material 43 is contained within the enclosed space, and does not migrate to other areas of the lithographic apparatus, as would otherwise be the case. Migration of evaporated monomer to other parts of the machine would over time cause pollution of those parts of the lithographic apparatus, for example an upper surface of the template 40 or various mechanical parts (not shown in FIG. 4). This contamination would over time reduce the performance of the lithographic apparatus, or even prevent it from operating.

The imprint template may in some cases be held by a template holder. In this case, the entity 40 shown in FIGS. 4 and 5 comprises a template holder and an imprint template. The template holder comprises the upper portion, and the imprint template comprises the lower portion. The seals 47 are attached to the template holder. Alternatively or in addition, the seals 47 could be attached to the imprint template. Using a template holder allows the imprint template to be easily swapped for an imprint template having a different pattern.

Although the enclosed space 50 has been described as being sealed from a surrounding area, it will be appreciated that there may be some instances in which one or more of the seals is not quite perfect. For this reason, the enclosed space 50 may be described as being substantially sealed from a surrounding area.

One or more embodiments of the invention have been described in terms of an imprintable material comprising one or more monomers, and a gas comprising the one or more monomers. It will be appreciated that in a situation in which the imprintable material does not comprise one or more monomers, but some other substance that may be cured in some way, then the gas will correspondingly comprise that substance.

The content of the gas in the enclosed space 50 may be adjusted using the one way valves 51, 52. For example, more of a particular constituent may be added to the gas, then some of the gas may be removed, with the result that the pressure of the gas remains substantially the same but the content of the gas is changed.

Whilst specific examples of the invention have been described above, it will be appreciated that the present invention may be practiced otherwise than as described. The description is not intended to limit the invention.

The invention claimed is:

1. A lithographic apparatus comprising:
   an imprint template or a template holder configured to hold an imprint template;
   a substrate table arranged to receive a substrate;
   a wall which together with the substrate table and the imprint template or the template holder, are configured to form an enclosed space which is substantially sealed from a surrounding area, and a seal configured to connect the imprint template or the template holder and the wall and to seal the imprint template or the template holder against the wall, and/or a seal configured to connect the substrate table and the wall and to seal the substrate table against the wall.

2. The lithographic apparatus according to claim 1, wherein one or more valves are connected to the enclosed space, to allow the content and/or pressure of gas within the enclosed space to be controlled.

3. The lithographic apparatus according to claim 2, wherein the one or more valves comprise one or more input valves and one or more output valves.

4. The lithographic apparatus according to claim 3, wherein the one or more input valves are arranged to allow gas into the enclosed space as the volume of the enclosed space increases.

5. The lithographic apparatus according to claim 3, wherein the one or more output valves are arranged to allow gas out of the enclosed space as the volume of the enclosed space decreases.

6. The lithographic apparatus according to claim 3, wherein the one or more output valves are arranged to apply a vacuum when the imprint template is in contact with a substrate.

7. The lithographic apparatus according to claim 2, wherein the one or more valves are located in the wall of the lithographic apparatus.

8. The lithographic apparatus according to claim 7, wherein the one or more valves are located adjacent to the substrate table.

9. The lithographic apparatus according to claim 2, wherein the one or more valves are connected to a gas reservoir, a gas cleaner, or both.

10. The lithographic apparatus according to claim 2, wherein the one or more valves are connected to a pressure chamber which is arranged to compensate for the varying volume of the enclosed space during movement of the imprint template or the template holder.

11. The lithographic apparatus according to claim 1, wherein a seal is provided between the substrate table and the wall of the lithographic apparatus.

12. The lithographic apparatus according to claim 1, wherein the imprint template or the template holder is provided with a seal which seals the imprint template or the template holder against the wall of the lithographic apparatus.

13. The lithographic apparatus according to claim 2, wherein the apparatus further comprises a shield which is arranged to shield the one or more valves from UV light used to cure imprintable material provided on the substrate.

14. The lithographic apparatus according to claim 1, wherein the apparatus is configured to provide a gas to the enclosed space.

15. The lithographic apparatus according to claim 14, wherein the gas is from a source of gas comprising one or more substances which are constituents of an imprintable material provided on the substrate.

16. The lithographic apparatus according to claim 15, wherein the one or more substances comprise one or more monomers.

17. The lithographic apparatus according to claim 15, wherein the pressure of the one or more substances in the gas is sufficient to inhibit the evaporation of the imprintable material.

18. The lithographic apparatus according to claim 15, wherein the pressure of the one or more substances in the gas is below saturation level.

19. The lithographic apparatus according to claim 15, wherein the gas comprises one or more inert gases.

20. A lithographic apparatus comprising:
an imprint template or a template holder configured to hold an imprint template;
a substrate table arranged to receive a substrate;
a wall which together with the substrate table and the imprint template or the template holder,are configured to form an enclosed space which is substantially sealed from a surrounding area, and
a source of a gas comprising one or more substances which are constituents of an imprintable material provided on the substrate,
wherein the apparatus is configured to provide the gas to the enclosed space.

21. The lithographic apparatus according to claim 20, wherein the one or more substances comprise one or more monomers.

22. The lithographic apparatus according to claim 20, wherein the pressure of the one or more substances in the gas is sufficient to inhibit the evaporation of the imprintable material.

23. The lithographic apparatus according to claim 20, wherein the pressure of the one or more substances in the gas is below saturation level.

24. The lithographic apparatus according to claim 20, wherein the gas comprises one or more inert gases.

25. A lithographic apparatus comprising:
an imprint template or a template holder configured to hold an imprint template;
a wall; and
a substrate table arranged to receive a substrate,
wherein the substrate table is movable into connection with the wall so as to form, by the connection, an enclosed space within the wall and the substrate table which space is substantially sealed from a surrounding area.

26. The lithographic apparatus according to claim 25, further comprising a seal between the substrate table and the wall.

27. The lithographic apparatus according to claim 25, further comprising a seal between the imprint template or the template holder and the wall to seal the imprint template or the template holder against the wall.

28. The lithographic apparatus according to claim 25, further comprising one or more valves, connected to the enclosed space, to allow the content and/or pressure of gas within the enclosed space to be controlled.

29. The lithographic apparatus according to claim 28, wherein one or more valves are arranged to allow gas into the enclosed space as the volume of the enclosed space increases.

30. The lithographic apparatus according to claim 28, wherein one or more valves are arranged to allow gas out of the enclosed space as the volume of the enclosed space decreases.

31. The lithographic apparatus according to claim 28, wherein one or more valves are arranged to apply a vacuum when the imprint template is in contact with a substrate.

* * * * *